United States Patent
Davey et al.

(10) Patent No.: US 9,673,344 B2
(45) Date of Patent: Jun. 6, 2017

(54) APPARATUS AND METHOD FOR PHOTOVOLTAIC MODULE WITH TAPERED EDGE SEAL

(71) Applicant: LUMETA, LLC, Irvine, CA (US)

(72) Inventors: Timothy Michael Davey, Newport Beach, CA (US); Brian Joseph Flaherty, Alamo, CA (US); Erwang Mao, Palo Alto, CA (US)

(73) Assignee: LUMETA, LLC, Irvine, CA (US)

( * ) Notice: Subject to any disclaimer, the term of this patent is extended or adjusted under 35 U.S.C. 154(b) by 127 days.

(21) Appl. No.: 14/454,226

(22) Filed: Aug. 7, 2014

(65) Prior Publication Data

US 2016/0043255 A1  Feb. 11, 2016

(51) Int. Cl.
| | |
|---|---|
| *H01L 31/048* | (2014.01) |
| *H01L 31/049* | (2014.01) |
| *H02S 40/34* | (2014.01) |
| *H01L 31/18* | (2006.01) |
| *H01L 31/04* | (2014.01) |
| *H02S 20/24* | (2014.01) |

(52) U.S. Cl.
CPC .......... *H01L 31/048* (2013.01); *H01L 31/04* (2013.01); *H01L 31/18* (2013.01); *H02S 20/24* (2014.12); *H02S 40/34* (2014.12); *Y02B 10/12* (2013.01); *Y02E 10/50* (2013.01); *Y02P 70/521* (2015.11)

(58) Field of Classification Search
CPC .............. H01L 31/048; H01L 31/0481; H01L 31/0488; H01L 31/049
USPC ........................................................ 136/251
See application file for complete search history.

(56) References Cited

U.S. PATENT DOCUMENTS

| 6,462,265 B1 * | 10/2002 | Sasaoka et al. ............... 136/251 |
| 7,531,740 B2 | 5/2009 | Flaherty et al. |

(Continued)

FOREIGN PATENT DOCUMENTS

| EP | 2 320 479 A1 | 5/2011 |
| EP | 2 600 426 A2 | 6/2013 |

(Continued)

OTHER PUBLICATIONS

Transmittal; international Search Report; and the Written Opinion of the International Searching Authority for International Application No. PCT/US2014/069356 with a mailing date of Jul. 6, 2015.

*Primary Examiner* — Bethany L Martin
(74) *Attorney, Agent, or Firm* — Katten Muchin Rosenman LLP (57) ABSTRACT

A photovoltaic module generates electrical power when installed on a roof. The module is constructed as a laminated sandwich having a transparent protective upper layer adhered to a photovoltaic layer. The photovoltaic layer is adhered to the top of a rigid layer, preferably formed from a fiber reinforced plastic. A tapered edge seal is disposed about the peripheral outer edge of the module, so that water and debris easily run off Preferably, the tapered edge seal is disposed adjacent the photovoltaic layer, and above the rigid substrate layer. The tapered edge seal is thinner at the outer peripheral portion thereof than at a portion thereof adjacent the photovoltaic layer. The laminated module preferably has a layer of double stick tape on the bottom to adhere the module to the surface of a roof.

17 Claims, 9 Drawing Sheets

(56) References Cited

U.S. PATENT DOCUMENTS

| | | |
|---|---|---|
| 7,557,291 B2 | 7/2009 | Flaherty et al. |
| 2005/0178428 A1 | 8/2005 | Laaly et al. |
| 2008/0149169 A1* | 6/2008 | Flaherty et al. .............. 136/251 |
| 2010/0243026 A1 | 9/2010 | Shima |
| 2010/0294341 A1 | 11/2010 | Frank et al. |
| 2011/0155221 A1* | 6/2011 | Yu ......................... H01L 31/048 136/251 |
| 2012/0085407 A1* | 4/2012 | Yamashita et al. ........... 136/256 |
| 2012/0107615 A1* | 5/2012 | Hetzler et al. ................ 428/412 |
| 2013/0133724 A1* | 5/2013 | Bae et al. ..................... 136/251 |
| 2013/0133725 A1* | 5/2013 | Nakatani ...................... 136/251 |
| 2014/0174508 A1* | 6/2014 | Sznerski et al. .............. 136/251 |

FOREIGN PATENT DOCUMENTS

| | | | | |
|---|---|---|---|---|
| EP | 2752890 A1 | 7/2014 | | |
| JP | 2000-036611 A | 2/2000 | | |
| JP | 2001-267596 A | 9/2001 | | |
| JP | 2010-129753 A | 6/2010 | | |
| WO | 2009/126914 A2 | 10/2009 | | |
| WO | 2010/019829 A1 | 2/2010 | | |
| WO | WO2012067965 | * | 4/2012 | ........... H01L 31/048 |

* cited by examiner

FIG. 1
Module 100

FIG. 2
Module 100

**FIG. 3
Module 100**

FIG. 6
Module 100

FIG 7
Module 100

FIG. 8a
Module 100

FIG. 8b
Module 100

FIG. 9
Module 100

FIG. 10
Module 100

US 9,673,344 B2

APPARATUS AND METHOD FOR PHOTOVOLTAIC MODULE WITH TAPERED EDGE SEAL

BACKGROUND OF THE INVENTION

1. Field of the Invention

The present invention relates to solar modules for generating electrical energy, and more particularly to photovoltaic modules integrated into a laminated, weather resistant sandwiched module for installation on roofs, and more particularly to apparatus and method for edge seals for such photovoltaic modules.

2. Description of the Related Art

Conventional photovoltaic modules for generating electrical power for residences and businesses are often flat and are placed on a portion of a roof that is exposed to the sun. Historically, such modules were placed on structures erected on the roof to support and protect the modules. More recently, photovoltaic modules have become available that can be mounted directly on a flat or tilted roof. See, for example, US Patent Application Publication No. 2005/0178248 A1 to Laaly et al., (the entire contents of which are incorporated herein by reference), which discloses a module that incorporates a roofing membrane into the module structure. The module is intended to be installed on a new roof or replacement roof with the membrane providing moisture protection for the underlying structure as well as providing electrical power.

See also U.S. Pat. Nos. 7,531,740 and 7,557,291 both to Flaherty, et al., the entire contents of both of which are incorporated herein by reference. These patents disclose such photovoltaic modules for roof-top installation.

A problem with above mentioned direct roof top attached crystalline silicon photovoltaic cell based solar modules is their tendency to retain water or other deleterious solids and/or liquids around the edge seals. See, for example, FIG. 2 of U.S. Pat. No. 7,531,740. After a rain, or after a cleaning with water and chemicals, such liquids and/or solids are often retained in the area adjacent the upper protective layer 110 and the frame half 180. After some time, these liquids can deteriorate the upper protective layer and/or the half frame, and leak into the module itself, shorting-out one or more of the solar cells. Another known problem with prior designs is that often the bottom frame half 180 is thicker than pressure sensitive adhesive (PSA) tape layer 160, thus reducing the ability of the module 100 to stick securely to the roof around the frame of the module. Thus, what is needed is a photovoltaic module with improved edge seal design to prevent such liquid damage and to enhance the ability of the module to stick to the roof.

SUMMARY OF THE INVENTION

The photovoltaic module described herein and illustrated in the attached drawings enables the electricity-generating solar module to be installed on an existing flat or tiled roof, and prevents the liquids/solids-damage noted above. In particular, the module edge seal is tapered away from the module surface, so that water and other liquids and/or solids are deflected off of the module and are not retained on the surface thereof.

In accordance with one aspect of the present invention, a photovoltaic module has an upper transparent protective layer, and a photovoltaic layer positioned beneath the upper transparent protective layer. The photovoltaic layer includes a plurality of electrically interconnected photovoltaic cells disposed in an array. A rigid substrate layer is positioned beneath the photovoltaic layer. A tapered edge seal is disposed (i) adjacent the photovoltaic layer, (ii) above the rigid substrate layer, and (iii) beneath the transparent protective layer. The tapered edge seal is thinner at an outer peripheral portion thereof than at a portion thereof adjacent the photovoltaic layer. An adhesion layer has a first surface attached to an exposed lower surface of the rigid substrate layer, and has a second surface for adhering the module to a roofing surface.

In accordance with another aspect of the present invention, a photovoltaic module has an upper transparent layer, and a photovoltaic layer positioned beneath the upper transparent layer. The photovoltaic layer includes (i) a plurality of electrically interconnected photovoltaic cells disposed in a two-dimensional array and (ii) an electrical junction box on the same side of the module as the array of cells. A first layer of heat-activated transparent adhesive is interposed between the upper transparent layer and the photovoltaic layer to adhere the photovoltaic layer to the upper transparent layer. A rigid layer is positioned beneath the photovoltaic layer. A second layer of heat-activated transparent adhesive is interposed between the photovoltaic layer and the rigid layer to adhere the photovoltaic layer to the rigid layer. An edge seal is disposed about a periphery of the module, beneath said upper transparent layer, above said rigid layer, and beside said photovoltaic layer. The edge seal is thicker adjacent the photovoltaic layer than at an outermost edge of the edge seal.

In accordance with a further aspect of the present invention, a method of making a tapered edged photovoltaic module includes: (i) disposing a photovoltaic layer on a rigid substrate, the rigid substrate being wider and longer than the photovoltaic layer; (ii) forming a tapered edge seal sideways adjacent the photovoltaic layer such that (i) an outer edge of the tapered edge seal is co-extensive with an outer edge of the rigid substrate, and (ii) the tapered edge seal tapers downward from the area adjacent the photovoltaic layer to the outer edge of the rigid substrate; and (iii) forming a protective layer over the photovoltaic layer to prevent water and moisture ingress.

BRIEF DESCRIPTION OF THE DRAWINGS

Certain aspects in accordance with embodiments of the present invention are described below in connection with the accompanying drawing figures in which.

DETAILED DESCRIPTION OF THE PREFERRED EMBODIMENTS

Figure 6:
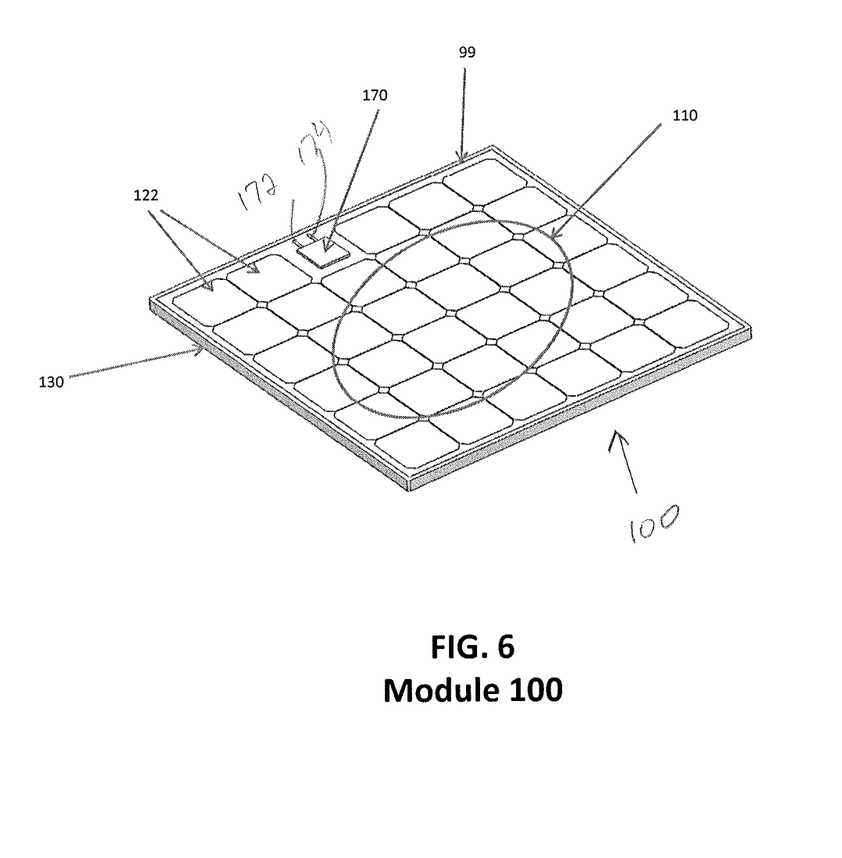
FIG. 6 illustrates a perspective view of another embodiment of a laminated photovoltaic module according to the present invention.

As illustrated in FIGS. 1, 2, 3, 4, and 5, a laminated photovoltaic module 100 is preferably configured as a generally rectangular module, which is sized and shaped in accordance with the sizes and shapes of conventional building materials, such as a 4×8 foot module. Thus, the module 100 can be handled by a construction crew without requiring any special material handling equipment. Of course, the module 100 may be any convenient size (4×8, 4×4, 3×3, 3×2, 2×2, 2×1, 1×1, etc.), and shape (square, round, triangular, trapezoidal, etc.) useful in the construction industry, and with either rounded corners or substantially right angle corners. The module 100 is preferably assembled in a factory or other suitable environment so that the module 100 is complete and ready to install on a substantially flat roof (which may be horizontal or tilted), or sloped shingle roofs, such as, but not limited to, asphalt, laminated, wood, slate, or other location having adequate exposure to the sun. In one preferred embodiment, as shown in FIGS. 1, 2, 3, 4, and 5, the module 100 has dimensions of approximately 101 centimeters (~40 inches) by 196 centimeters (~77 inches) and has a thickness of approximately 0.5 centimeter (0.2 inch). In another preferred embodiment, as shown in FIG. 6, the module 100 has dimensions of approximately 101 centimeters (~40 inches) by 101 centimeters (~40 inches) and has a thickness of approximately 0.3 centimeter (⅛ inch) when installed. In fact, the thickness of the module is preferably the same as (or thinner than) the thickness of the laminated roofing shingle. Thus, the module 100 does not add significant height to a roof structure and will not block water flow on sloped roof. In yet another embodiment, the module 100 has dimensions of approximately 101 centimeters (~40 inches) by 239 centimeters (~94 inches) and has a thickness of approximately 0.5 centimeter (0.2 inch).

Figure 7:
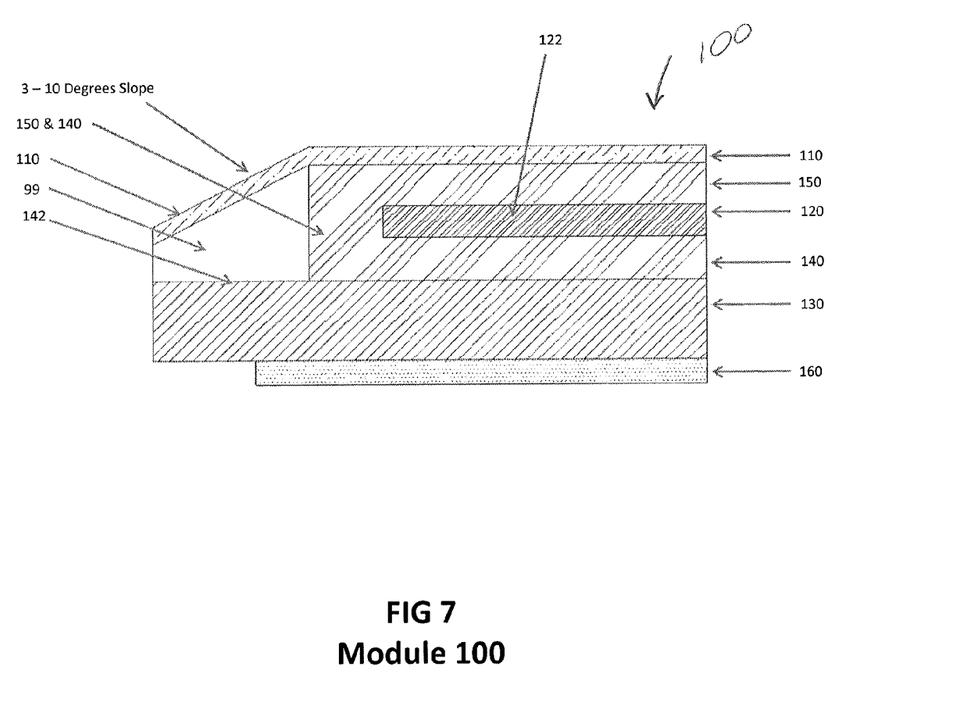
FIGS. 7 illustrates a cross section view of photovoltaic modules of FIG. 1 and FIG. 6.

As shown in FIG. 7, the module 100 preferably has a transparent upper protective layer 110 that faces upward and is exposed to the sun. A middle layer 120 is preferably positioned beneath the upper protective layer 110. The middle layer 120 comprises a plurality of photovoltaic cells 122 electrically interconnected to form a photovoltaic array. The middle layer 120 preferably rests on a rigid lower substrate 130. The middle layer 120 is preferably secured to the rigid lower layer 130 by a lower adhesive layer 140. The middle layer 120 is preferably secured to the upper protective layer 110 by an upper adhesive layer 150. The middle layer 120 is thus encapsulated between the lower adhesive layer 140 and the upper adhesive layer 150.

The upper protective layer 110 preferably provides impact protection as well as weather protection to the module 100. The upper protective layer 110 advantageously comprises of a transparent flexible polymer material, such as, but not limited to Ethylene tetrafluoroethylene (ETFE), a fluorine based co-polymer, which is formed into a film layer of suitable thickness (e.g., approximately 0.005-0.013 centimeter (0.002-0.005 inch)). Thus, the photovoltaic cells 122 in the middle layer 120 are exposed to direct sunlight without being exposed to moisture and other climatic conditions and without being exposed to direct impact by feet, falling objects, and debris. Tempered glass having a suitable thickness may also be used as the upper protective layer 110.

Figure 3:
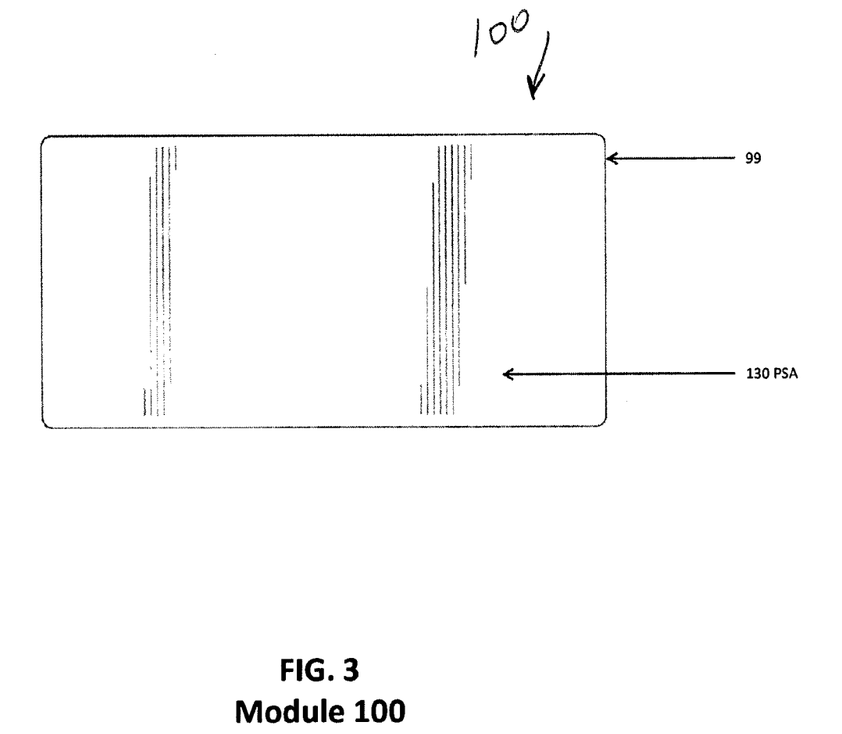
FIG. 3 illustrates a bottom view of the photovoltaic module of FIG. 1.
Figures 4, 5:
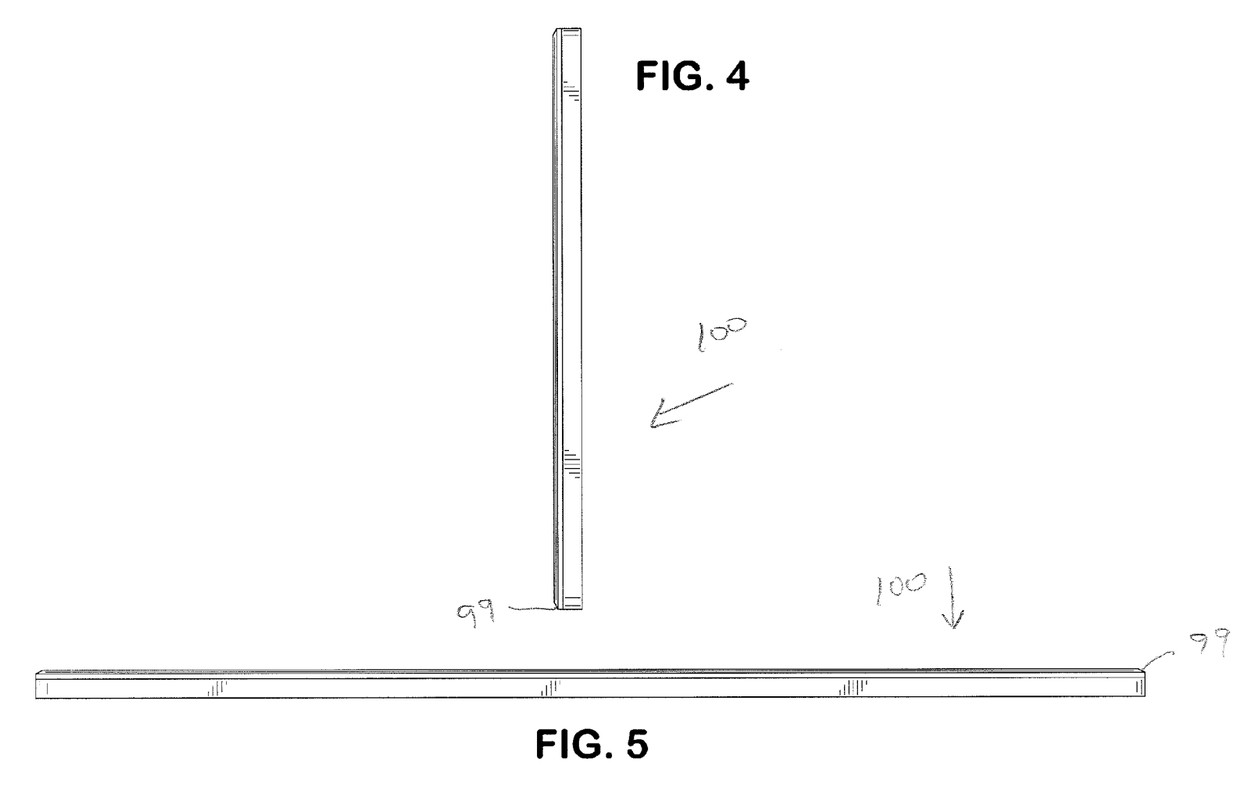
FIG. 4 illustrates an end view of the photovoltaic module of FIG. 1.
FIG. 5 illustrates a side view of the photovoltaic module of FIG. 1.

In the illustrated embodiment of FIGS. 3, 4, and 5, the rigid lower layer substrate 130 preferably comprises fiber reinforced plastic (FRP). For example, the FRP layer 130 advantageously comprises a polyester resin with embedded stranded glass fibers. Preferably the said FRP layer has a thickness of approximately 0.1 centimeter to 1 centimeter (0.079 inch-0.39 inch), and additionally, the said FRP lower surface can be either flat or with a defined pattern/rib. The lower layer 130 of FRP thus provides an advantageous combination of rigidity, light weight, very low permeability, and flatness.

Preferably, the lower adhesive layer 140 is provided as a thin film that is positioned on the upper surface of the rigid lower layer 130. The array of photovoltaic cells 122 in the middle layer 120 is then positioned on the lower adhesive layer 140. In the illustrated embodiment, the lower adhesive layer 140 advantageously comprises a transparent adhesive, such as, for example, ethylene-vinyl-acetate (EVA). EVA is a transparent, heat-activated adhesive that is particularly suitable for securing the cells. Other suitable adhesives, such as, for example, polyvinylbuterol (PVB), thermoplastic poly-olefin (TPO), Silicone, Ionomers, reactive poly-olefin (PO) or other pottant materials, can be substituted for the EVA. In a preferred embodiment, a layer 142 (FIG. 7) of DuPont™ Tedlar™ is disposed between the substrate 130 and the middle layer 120 (in addition to adhesive layer 140). Tedlar™ is a highly versatile polyvinyl fluoride film (PVF) that provides a long-lasting finish to a wide variety of surfaces exposed to harsh environments.

The preferred embodiment provides an improved design and implementation of a tapered edge seal 99 for photovoltaic modules. The tapered edge seal design replaces the thick edge rim 180 (shown in U.S. Pat. No 7,531,740) around the periphery of the module with a seal material. Thus, the new design is "frameless." The seal 99 is preferably formed as a seamless structure around the outer peripheral edges of the module 100 (see FIGS. 2 and 7). The seal 99 may comprise a sloped portion of layer 110, but is more preferably a section of tapered material (to be described below) sandwiched between the flexible thin film superstrate 110 (0.025 mm to 0.1 mm thick) and the rigid substrate 130, and bonded to both the superstrate and the substrate on top and bottom surfaces of the seal 99, as will be described in greater detail below with respect to the embodiment of FIG. 7. Alternatively, the seal 99 may be bonded to the side of middle layer 120 by, preferably, an encapsulation material on the inner face of the seal 99. The outer face of the seal 99 is preferably exposed to ambient, but may be covered with a protective layer, such as an extension of protective layer 110. Alternative embodiments may include any combination of: the layer 110 not extending over top of the seal 99; the layer 110 extending to the edge of the module 100, beneath the seal 99, but on top of the substrate 130; the layer 110 extending downward on the outer-facing surface of the middle layer 120, but not beneath the seal 99; and/or portion(s) of protective layer 110 enclosing seal 99 may comprise a flat portion (0-50%) of seal 99 width and a sloped portion of (100-50%) of seal 99 width (as measured from the edge of the middle layer 120.

The tapered seal design thus removes the former rim on the top surface of the module 100, and thus eliminates water and dust trapped on the side edge of the top surface of layer 110. In addition, the tapered edge seal design preferably incorporates the flexible nature of the superstrate 110 that generates a gradual profile on the edges of the module that helps water run off (see FIG. 7). Furthermore, this design does not add any profile on the bottom face of the module 100, and this allows module 100 to be somewhat more flexible, allowing the module to be more closely conform to the roof surface, which may not be completely flat. Thus, the module 100 according to the present invention may be safely installed on non-flat surfaces.

Figure 9:
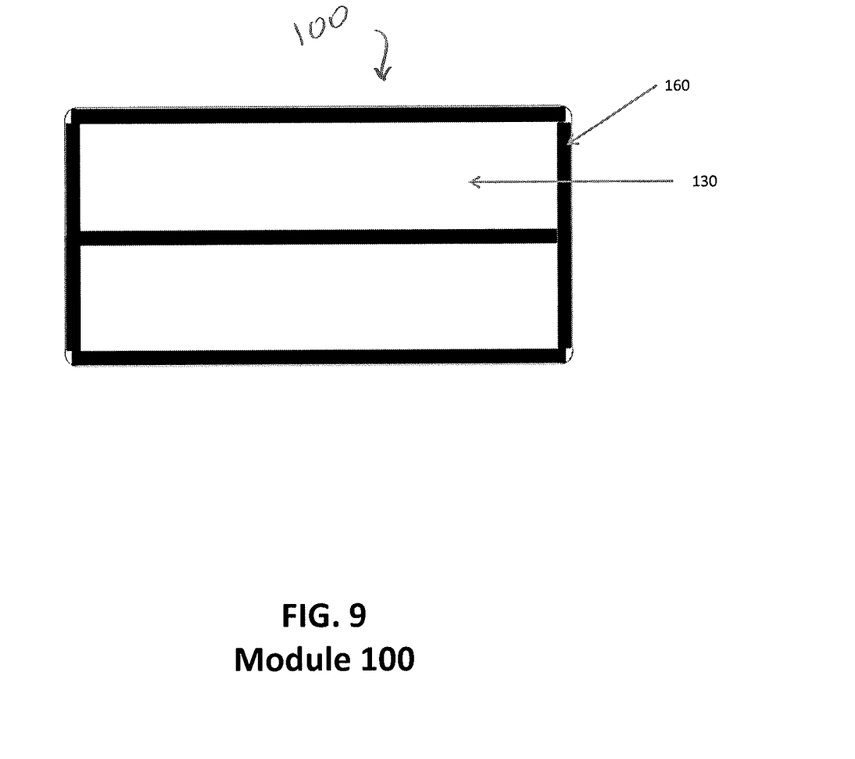
FIG. 9 illustrates a pattern for placing adhesive tape on the back of the photovoltaic module of FIG. 1.
Figure 10:
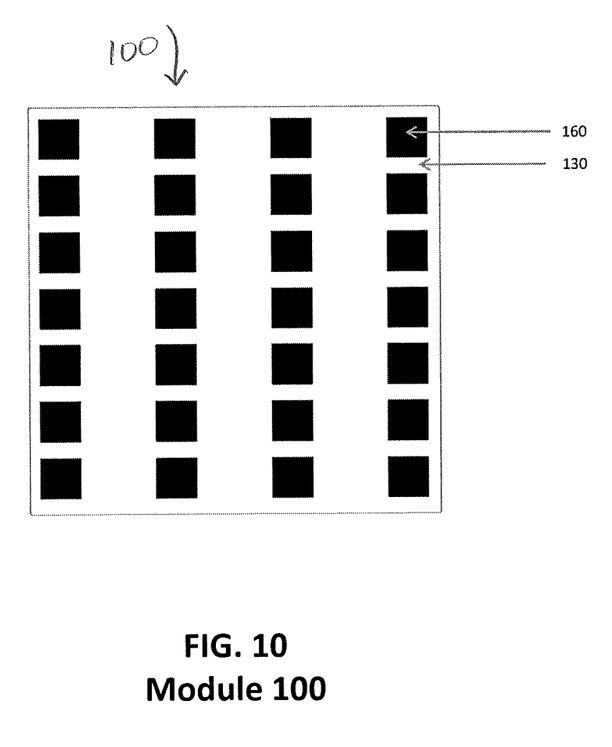
FIG. 10 illustrates a pattern for placing adhesive tape on the back of the photovoltaic module of FIG. 6.

An additional benefit for the tapered edge seal design is that the module's back side is flat (without a frame edge), and thus a thinner pressure sensitive adhesive (PSA) tape can be employed (as shown in FIGS. 9 and 10). Currently, thicker PSA tape is required due to edge rim thickness on the backside of the modules, as shown in FIG. 1 of U.S. Pat. No. 7,531,740. PSA tape for modules with the tapered edge seal design may be applied in the same pattern as for the module with the edge rim. The difference for applying PSA tape on modules with the tapered edge seal is that the tape may now lay closer to the edges of the substrate, as shown in FIG. 9.

Preferably; the edge seal 99 is comprised of a polymeric material which is water resistant and a gas ingress barrier (with low gas permeation rate), and is UV resistant. The seal material should show strong adhesion to both superstrate and substrate surfaces. The edge seal 99 can be either in the form solid tape or liquid paste. When in tape form, the edge seal preferably has a width ranging from 10 mm to 25 mm and a thickness from 1 mm to 2 mm. A preferred edge seal tape is HelioSeal™ PVS 101 from ADCO, Michigan Center, Michigan. HelioSeal™ PVS 101 is a synthetic polymer based sealant with integrated desiccant for moisture trapping; well-known to comprise Polyisobutylene (PIB), furnished as pumpable paste or extruded tape. It is possible for the edge seal material to comprise one or more of the materials comprising the middle layer 120.

One edge seal embodiment is shown in FIG. 7, which is a schematic, partial, cross-sectional view of the module 100 that shows the edge seal 99 design configuration (not to scale). The edge seal 99 is preferably bonded on its lower surface to substrate 130 (and/or on top of adhesive layer 140). And/or the inner face of seal 99 may be bonded to an outer face of the encapsulated middle layer 120. And/or the upper face of the edge seal 99 may be bonded to a lower surface of the upper protective layer 110 (although the upper face 99 could be bonded to a lower face of adhesive layer 150). As can be seen in FIG. 7, the edge seal 99 tapers away from the middle layer 120 toward the outer peripheral edge of the module 100. As can be seen in FIGS. 4 and 5, the taper is preferably 3-10 degrees of slope (more preferably 4-9 degrees, even more preferably 5-8 degrees, and 6-7 degrees most preferred), beginning at about 0-30 percent of the distance from (i) the interface of the edge seal 99 and the middle layer 120 and (ii) the outer edge of the module 100.

Figure 8A:
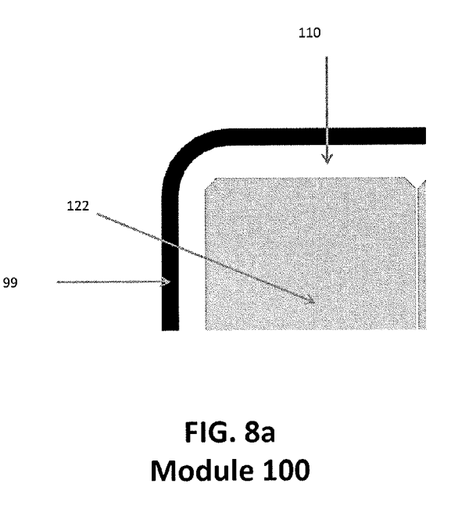
FIGS. 8*a* and 8*b* illustrate close-up top views of the edge seals of the laminated photovoltaic modules of FIG. 1 and FIG. 6, respectively.
Figure 8B:
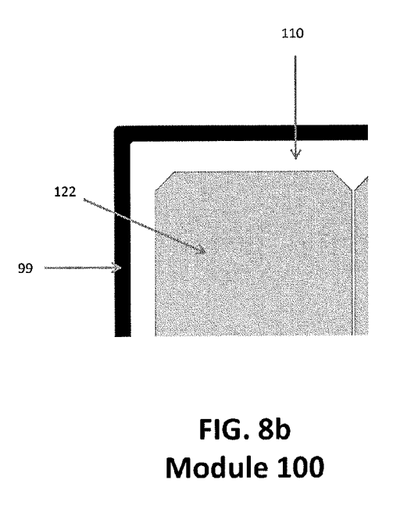

As shown in FIG. 8a, the corners of the module 100 are preferably radiused around the corners, making a smooth transition from one edge of the module 100 to the other. The corner surface of the tapered edge seal 99 thus presents a shallow, partial, shallow, quarter frusto-conical shape. If tape is used for the edge material instead of a liquid or paste, an overlap of tapes at the corners is preferred to eliminate seams in the edge seal at the corners, in order to minimize possible water and moisture ingress. As shown in FIG. 8b, the corner of the module 100 may have a more right-angle configuration, with the seal 99 presenting a sharper, partial, quarter frusto-conical shape.

FIGS. 9 and 10 show various configurations for peel-and-stick tape 160 to be applied to the bottom surface of the substrate 130. In FIG. 9, the PSA tape 160 is preferably applied to the peripheral edges of the module 100, preferably together with one or more vertical and/or horizontal stripes across the module bottom face. This is a preferred embodiment for flat roof application. In FIG. 10, a number of squares (or rectangles) of PSA tape 160 are affixed to the bottom surface of the module 100, preferably in a matrix array (4 columns by 7 rows in the disclosed embodiment). This is a preferred embodiment for sloped shingle or tile roofs. Alternatively, the PSA tape 160 can be applied in two or more horizontally (or vertically) extending stripes of tape.

The edge seal material is preferably incorporated in photovoltaic modules in a process that will be described in greater detail below, but generally comprises positioning the tape seal 99 on the substrate 130 along the edges of the substrate with the middle layer 120 disposed within (inside) the edge seal on the substrate 130. The rest of the layup process is substantially the same as will be described below. The assembly is laminated through a vacuuming thermal compression process commonly used in crystalline silicon PV module manufacturing process. The seal material 99 preferably forms a seamless frame around the module edges after the process. The process produces a flat top surface with a gradual profile on the edges and without a rim at module edges.

In FIG. 7, in greater detail, a Tedlar layer 142 is positioned over the top surface of the substrate 130, and the adhesive layer 140 is placed on top of the Tedlar layer 142. After positioning the array of photovoltaic cells 122 on the lower adhesive layer 140, the upper transparent adhesive layer 150 is placed over the middle layer 120 so that the photovoltaic cells 122 are sandwiched between the two transparent adhesive layers 140 and 150. Preferably, the upper adhesive layer 150 should match the physical characteristics of the lower adhesive layer 140. In the illustrated embodiment, both the upper adhesive layer 150 and the lower adhesive layer 140 comprise EVA, but other suitable transparent adhesives can be substituted for the EVA. The edge seal 99 is preferably then applied to the outer peripheral edges of the module 100, outside the encapsulated middle layer 120. Then, the transparent upper protective layer 110 is positioned over the upper transparent adhesive layer 150 and the edge seal 99 to complete the structure shown in an enlarged partial cross section in FIG. 7. Alternatively, module layup could start from laying down first the upper protective layer 110, followed by (in order) upper transparent adhesive layer 150, photovoltaic cells 122, and lower adhesive layer 140. Edge seal 99 placements follow the same procedure as stated above, and last substrate 130 is placed.

The EVA material and the use of the EVA material to bind the layers of a laminated photovoltaic cell are described, for example, in U.S. Pat. No. 4,499,658 to Lewis (incorporated herein by reference). In addition to acting as a binder to secure the photovoltaic cells 122 between the upper protective layer 110 and the lower rigid layer 130, the upper EVA layer 150 and the lower EVA layer 140 also act as cushions between the two outer layers.

Figure 1:
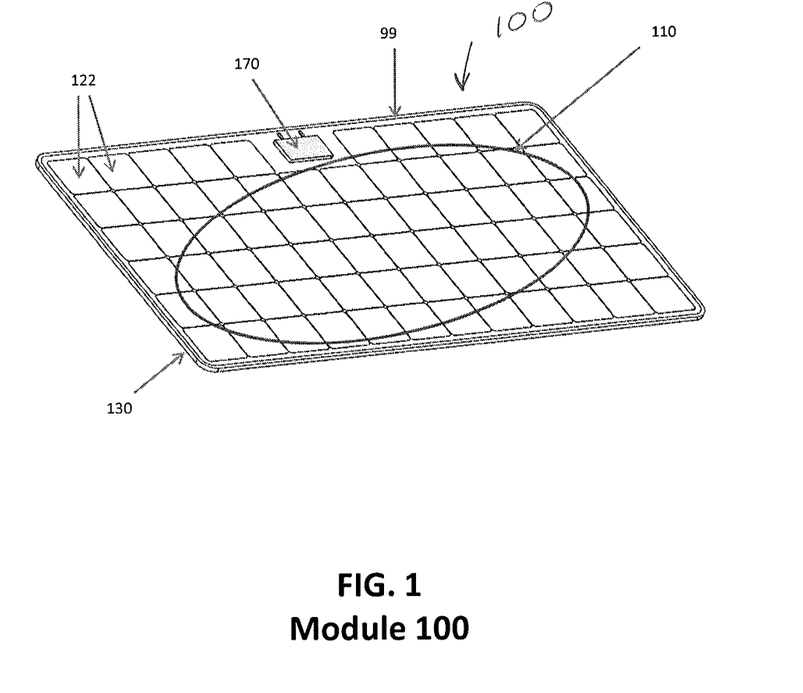
FIG. 1 illustrates a perspective view of a first embodiment of a laminated photovoltaic module according to the present invention.
Figure 2:
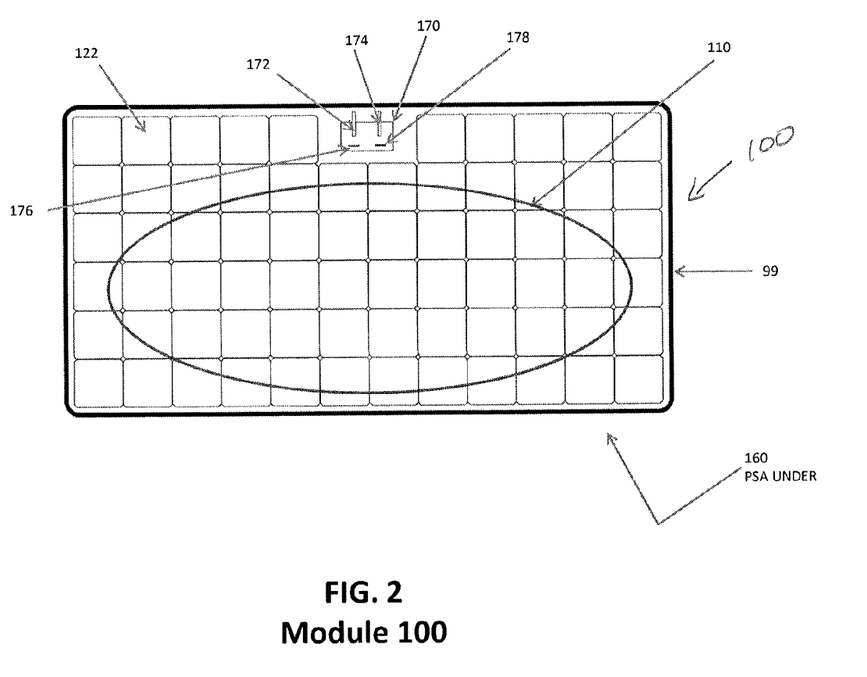
FIG. 2 illustrates a top view of the photovoltaic module of FIG. 1 with junction box showing conductors.

The photovoltaic cells 122 are electrically interconnected in a series-parallel configuration in a conventional manner to provide a suitable output voltage or a desired photovoltaic module form factor. For example, FIGS. 1 and 2 show a photovoltaic module suitable for flat roof application. Photovoltaic cells 122 are arranged in 6 rows of 12 cells each; FIG. 6 shows a square-shaped photovoltaic module suitable for sloped residential composite shingle roof applications. Photovoltaic cells 122 are preferably arranged in 6 rows of 6 cells each; however, one, two, or more cells are preferably omitted from the uppermost row to provide room for positioning an electrical enclosure, such as, but not limited to junction box 170 (having a first weather-resistant electrical conductor 172 and a second weather-resistant electrical conductor 174), module power optimizer, micro inverter, and other useful electrical control and/or power-conditioning circuitry. The photovoltaic module 100 preferably includes two module output conductors 176, 178 (e.g., FIG. 2) that extend from the top surface of the middle layer 120 in the area of the omitted photovoltaic cell(s). Each of the module output conductors 176, 178 is preferably connected to a respective one of the weather-resistant electrical conductors 172, 174 within the electrical enclosure 170 after the photovoltaic module 100 is laminated, as discussed below.

For the lamination process, the upper protective layer 110, the middle layer 120, the lower layer 130, the two adhesive layers 140 and 150, and the Tedlar™ layer 142 have been stacked and are aligned to form the sandwich structure, as discussed above in FIG. 9 as well as FIG. 6. The edge seal material is then applied, as also discussed above. The free end of each of the module output conductors 176, 178 are preferably covered with a temporary covering (e.g., a PVFE, or the like) during the lamination process. The structure is permanently laminated in a known manner using heat and pressure. In one advantageous embodiment, the structure is laminated in a vacuum laminator in the manner described, for example, in US Patent Application Publication No. 2005/0178248 A1 to Laaly et al (incorporated herein by reference). In particular, the structure is first subjected to a vacuum to remove any trapped gas bubbles in the EVA adhesives. The structure is then subjected to high pressure to force the layers together as tightly as practicable. The structure is then heated to a suitable temperature (e.g., approximately 150 degrees C.) to cure the adhesives in the layers 140 and 150 and thereby permanently bond the adjacent layers.

The laminated structure is preferably held at the high temperature for a sufficient time to cure the upper transparent adhesive layer 150 and the lower transparent adhesive layer 140, and to cause the two transparent adhesive layers to adhere together to become a combined layer that completely encapsulates the photovoltaic cells 122. The high temperature also causes the upper transparent layer 110 and the edge seal 99 to soften and flow to provide the protective upper coating and the edge seal described above. The laminated structure is then allowed to cool to ambient temperature.

As shown in FIG. 10, the preferred method of installation of the module 100 on a composite shingle roof comprises applying a layer 160 of PSA tape to the bottom surface of the rigid lower layer 130. Positions of the PSA tapes are designed for common roof shingle course width, nominally about 5½ inches apart. Preferably, the tape layer 160 comprises a suitable double-stick tape, such as, for example but not limited to, a self-sealing tape having a formulation of resins, thermoplastics, curing rubbers, and non-curing rubbers. The double-stick tape has adhesive on both sides. When manufactured, the double-stick tape has a release layer on each side to prevent adhesion. One release layer is advantageously removed during the process of manufacturing the modules. The exposed adhesion side of the tape layer 160 is positioned on and adhered to the bottom surface of the rigid lower layer 130 before shipping the module 100. Then, during installation of the module 100, the remaining release layer is removed so that the module can be adhered to the surface of an existing roof. The surface of the existing roof is cleaned and suitably prepared to receive the module 100. After installation, suitable pressure is applied to the upper layer 110 of the module 100 to permanently adhere the module to the surface of the roof. In one preferred embodiment, The PSA tape 160 is 4" by 4" squares of Butyl tape. Preferably, the lower edge of the butyl tape is aligned approximately with the lower edge of each shingle course for installation, but the upper edge of the butyl tape may be spaced somewhat from the top edge of the module 100.

The present invention is disclosed herein in terms of a preferred embodiment thereof, which provides an exterior building module as defined in the appended claims. Various changes, modifications, and alterations in the teachings of the present invention may be contemplated by those skilled in the art without departing from the intended spirit and scope of the appended claims. It is intended that the present invention encompass such changes and modifications.

What is claimed is:

1. A photovoltaic module, comprising:
   an upper transparent protective layer disposed as a sunlight-incident surface;
   a photovoltaic layer positioned beneath the upper transparent protective layer, the photovoltaic layer comprising a plurality of electrically interconnected photovoltaic cells disposed in an array;
   an encapsulating material encapsulating the photovoltaic layer;
   a rigid substrate layer positioned beneath the photovoltaic layer;
   a tapered edge seal disposed (i) adjacent the photovoltaic layer, (ii) above the rigid substrate layer, and (iii) vertically beneath the upper transparent protective layer, a portion of the upper transparent protective layer covering of a sloping surface of the tapered edge seal while leaving only an outer vertical surface of the tapered edge seal exposed to ambient air, said tapered edge seal being thinner at an outer peripheral portion thereof than at a portion thereof adjacent the photovoltaic layer, the tapered edge seal sloping surface sloping downward from the upper transparent protective layer toward the rigid substrate layer.

2. The photovoltaic module of claim 1, wherein the rigid substrate layer comprises a fiber reinforced plastic.

3. The photovoltaic module of claim 1, wherein, at a corner of the module, the tapered edge seal has a radiused edge.

4. The photovoltaic module of claim 1, wherein the tapered edge seal is bonded to the rigid substrate layer and to the upper transparent protective layer.

5. The photovoltaic module of claim 4, wherein the tapered edge seal has an inside edge bonded to the encapsulating material.

6. The photovoltaic module of claim 1, wherein the tapered edge seal is seamless.

7. The photovoltaic module of claim 1, wherein the tapered edge seal comprises a polymeric material which is water resistant and is UV resistant.

8. The photovoltaic module of claim 1, wherein the tapered edge seal comprises a solid tape.

9. The photovoltaic module of claim 1, wherein the tapered edge seal comprises a hardened liquid paste.

10. A photovoltaic module, comprising:
    an upper transparent layer disposed as a sunlight-incident surface;
    a photovoltaic layer positioned beneath the upper transparent layer, the photovoltaic layer comprising (i) a plurality of electrically interconnected photovoltaic cells disposed in a two-dimensional array and (ii) an electrical junction box disposed on the upper transparent layer;
    a first layer of heat-activated transparent adhesive interposed between the upper transparent layer and the photovoltaic layer to adhere the photovoltaic layer to the upper transparent layer;

a rigid layer positioned beneath the photovoltaic layer;

a second layer of heat-activated transparent adhesive interposed between the photovoltaic layer and the rigid layer to adhere the photovoltaic layer to the rigid layer;

the first and second layers of heat-activated transparent adhesive comprising an encapsulating material which encapsulates the photovoltaic layer; and an edge seal disposed about a periphery of the module, above said rigid layer, and beside said encapsulating material, the edge seal being thicker adjacent said encapsulating material than at an outermost edge of the edge seal, said edge seal having an inner vertical edge, an outer vertical edge, and a sloping surface sloping downward from the upper transparent layer toward the rigid layer, the upper transparent layer covering the sloping surface, only the outer vertical edge being exposed to ambient air.

11. The photovoltaic module of claim 10, wherein the photovoltaic module comprises a rectilinear shape having four corners, and wherein, at each of the four corners, the edge seal comprises a quarter frusto-conical shape.

12. The photovoltaic module of claim 10, wherein the edge seal comprises a tape.

13. A frameless photovoltaic module, comprising:

an upper transparent protective layer disposed as a sunlight-incident surface;

a photovoltaic layer positioned beneath the upper transparent protective layer, the photovoltaic layer comprising a plurality of electrically interconnected photovoltaic cells disposed in an array;

an encapsulating material encapsulating the photovoltaic layer;

a rigid substrate layer positioned beneath the photovoltaic layer;

a tapered edge seal disposed adjacent the photovoltaic layer, and above the rigid substrate layer, said tapered edge seal being thinner at an outer peripheral portion thereof than at a portion thereof adjacent the encapsulating material, said tapered edge seal tapering downward from the upper transparent protective layer toward the rigid substrate layer, said tapered edge seal having (i) an inner vertical surface, (ii) an outer vertical surface exposed to ambient air, and (iii) a sloping surface covered by the upper transparent protective layer.

14. The photovoltaic module of claim 11, wherein the quarter frusto-conical shape has a conical axis substantially orthogonal to a plane of the rigid layer.

15. The photovoltaic module of claim 1, wherein the tapered edge seal slopes downward at an angle of substantially 3-10 degrees from the sunlight-incident surface.

16. The photovoltaic module of claim 10, wherein the edge seal slopes downward at an angle of substantially 3-10 degrees from the sunlight-incident surface.

17. The photovoltaic module of claim 13, wherein the tapered edge seal slopes downward at an angle of substantially 3-10 degrees from the sunlight-incident surface.

* * * * *